United States Patent [19]
Igarashi et al.

[11] Patent Number: 5,861,715
[45] Date of Patent: Jan. 19, 1999

[54] DISCHARGE LAMP HAVING A PLURALITY OF COATING LAYERS

[75] Inventors: Tatsushi Igarashi, Tokyo; Osamu Mizuno, Mishima; Kazuo Nakamura, Kakogawa; Shoichi Mayama, Himeji, all of Japan

[73] Assignee: Ushiodenki Kabushiki Kaisha, Tokyo, Japan

[21] Appl. No.: 770,505

[22] Filed: Dec. 20, 1996

[30] Foreign Application Priority Data

Dec. 20, 1995 [JP] Japan ................................. 7-354972

[51] Int. Cl.⁶ ......................................................... H01J 17/16
[52] U.S. Cl. ........................... 313/635; 313/489; 313/112; 313/634
[58] Field of Search .................................... 313/489, 112, 313/634, 635

[56] References Cited

U.S. PATENT DOCUMENTS

| | | | |
|---|---|---|---|
| 4,524,410 | 6/1985 | Kawakatsu et al. | 313/112 |
| 4,721,877 | 1/1988 | Kawakatsu et al. | 313/112 |
| 5,550,423 | 8/1996 | Oughton | 313/635 |
| 5,552,671 | 9/1996 | Parham et al. | 313/112 |
| 5,646,472 | 7/1997 | Horikoshi | 313/112 |

*Primary Examiner*—Vip Patel
*Attorney, Agent, or Firm*—Sixbey, Friedman, Leedom & Ferguson; David S. Safran

[57] ABSTRACT

A discharge lamp in which ultraviolet radiation of short wavelengths can be advantageously cut and in which the amount of emitted light (i-line) of 365 nm wavelength can be increased is achieved according to the invention by providing a quartz glass arc tube that is coated with a plurality of coating layers which include a layer which has $Ta_2O_5$ as the main component, and at least one additional coating layer which has a refraction coefficient which differs from the refraction coefficient of the coating layer having the $Ta_2O_5$ main component. These layers act to prevent the reflection of light with a wavelength of 365 nm which is incident on the coatings on the arc tube and to cut at least 50% of the ultraviolet radiation having wavelengths of 230 nm or less. According to the invention, the coating layers can be provided on the outer side of the arc tube, on the inner side of the arc tube, or on both on the inner and outer sides of the arc tube.

12 Claims, 5 Drawing Sheets

DISCHARGE LAMP HAVING A PLURALITY OF COATING LAYERS

BACKGROUND OF THE INVENTION

1. Field of the Invention

The invention relates to a discharge lamp, especially a mercury lamp of the short arc type which is used to expose a semiconductor wafer and the like.

2. Description of the Prior Art

In a mercury lamp of the short arc type for a reduction projection exposure device of the stepper type which exposes a semiconductor wafer, mercury and an inert gas are encapsulated in an emission space which also contains a cathode and an anode opposite one another. Ultraviolet radiation is used which is emitted from the emission space. Hereinafter, this mercury lamp of the short arc type is called simply a lamp, for short. Conventionally, a g-line with a wavelength of 436 nm is mostly used. Recently, however, an i-line with 365 nm has been used according to miniaturization of the semiconductor.

Two disadvantages have been ascertained recently with respect to this lamp:

The first disadvantage is that ultraviolet radiation with short wavelengths is formed. However, it is necessary that no short-wave ultraviolet radiation be emitted since it reacts with the oxygen in the air, and thus, produces harmful ozone, and because it acts directly on the human skin and therefore is undesirable. If ultraviolet radiation of less than or equal to 200 nm is cut, which can also be called "filtering out", production of ozone can for the most part be prevented. To completely cut the ultraviolet radiation of less than or equal to 200 nm, there is a need for an absorption characteristic by which at least light with 230 nm is cut by at least 50%.

As processes for cutting of this short-wave ultraviolet radiation, there are conventional examples in which quartz glass is coated with titanium oxide ($TiO_2$), or in which quartz glass which is doped with $TiO_2$ is used as an arc tube. Recently, there has, furthermore, been a demand for cutting ultraviolet radiation with long waves.

A second problem is to increase the amount of light with 365 nm which is emitted from the lamp. Recently, in the semiconductor industry, exposure surfaces have been increasing in size in order to increase throughput in exposure processes. Furthermore, there is the tendency here that the required amount of ultraviolet light radiation per unit of surface area increases. Therefore, there is a need for a lamp with high power. However, such a lamp also has high heating power, for which reason a cooling device for keeping the temperature constant within the stepper also becomes very large and complicated. Consequently, it is a major problem to increase the amount of light with 365 nm while keeping the lamp power constant.

With regard to the first problem of cutting the short-wave ultraviolet radiation, 1) a process in which so-called doped quartz glass (or ozone-free quartz glass) is used, in which titanium oxide is mixed and dispersed into the above described quartz glass, 2) a process in which a diffusion layer of titanium oxide is applied to the inner surface of the arc tube by dipping and then burned in, as is known from Japanese patent HEI 4-34258, 3) a process in which the outer surface of the arc tube is coated with a glass layer which contains titanium dioxide and silicon oxide ($SiO_2$), as is known from the Japanese patent HEI 5-70901, or similar processes have been reported.

In these processes, ultraviolet radiation of less than or equal to 200 nm can be cut by roughly 100% and the ultraviolet radiation of 230 nm by roughly 50%. As was described above, for complete cutting of the ultraviolet rays of a wavelength less than or equal to 200 nm, it is necessary, with respect to the ozone, to cut at least 50% of the ultraviolet radiation of less than or equal to 230 nm. It is, however, more desirable to be able to cut ultraviolet radiation with wavelengths of less than 230 nm without cutting the ultraviolet radiation of 365 nm wavelength which is necessary for exposure.

The second problem, i.e., the attempt to increase the amount of light with 365 nm, was conventionally approached by optimizing the encapsulation amounts of mercury and rare gas, by optimizing the shapes of the anode and the cathode, and by similar methods.

Conventionally, the first and the second problems were solved separately. However, these processes can only solve one of the problems. Here, therefore, the two problems could not be solved at the same time.

It is also noted that a so-called multilayer anti-reflecting coating is known in which, by alternating a plurality of coating layers containing $Ta_2O_5$ with other coating layers on top of one another, a reflection characteristic for certain wavelengths is obtained.

With this multilayer anti-reflection coating, to increase the reflection factor of a certain wavelength ($\lambda$), coating layers of a high refraction coefficient (for example, $TiO_2$ with a refraction coefficient from 2.2 to 2.7 or $Ta_2O_5$ with a refraction coefficient from 2.2 to 2.4) and with coating layers with a low refraction coefficient (for example, $SiO_2$ with a refraction coefficient of 1.475 or $MgF_2$ with a refraction coefficient of 1.38), as the optical layer thickness (nd), coating in a thickness of ¼*$\lambda$ is performed in an alternating manner and a plurality of these layers are placed on top of one another.

In this technique, the desired reflection factor cannot be obtained with a small number of layers placed on top of one another. To obtain an essentially practicable reflection factor, coating conventionally had to be done with at least ten layers.

For example, Japanese patent HEI 2-18856 discloses a super-high pressure mercury lamp which is used for a stepper. Here, the technique of multilayer coating is described in which infrared light is reflected within the lamp in order to dispense with a filter or a cold mirror in the optical system.

Specifically, for reflecting light with a wavelength of 1000 nm with $Ta_2O_5$ and $SiO_2$ in a thickness of 250 nm, twelve layers of alternating coating are used and layers with a high refraction coefficient ($Ta_2O_5$) with a thickness of 250 nm and layers with a low refraction coefficient ($SiO_2$) with a thickness of 125 nm are placed on top of one another. Consequently, light with wavelengths of 800 to 1100 nm is reflected essentially within the lamp, and thus, a transmission factor of 0% is obtained.

Furthermore, Japanese patent HEI 7-19568 discloses a technique in which a hemispherical surface of a lamp is provided with a plurality of reflecting layers for reflecting light with a wavelength of 365 nm and in which light with a 365 nm wavelength is radiated from one half surface.

Specifically, a coating is produced with nine layers of $Ta_2O_5$ and $SiO_2$ with a thickness of 90 nm, with a layer thereof of a thickness of 100 nm, and then, with nine layers thereof with a thickness of 110 nm, and mainly light with a wavelength of 400 nm is reflected. It is known therefrom that essentially 100% of the light around 365 nm is reflected as a result.

In this prior art the desired light is reflected from the light which is emitted from the emission center in the arc tube, by mutual light interference as a result of the plurality of coating layers provided on the outer surface of the arc tube. Furthermore, an attempt is made here to transmit the desired light without losses by reflection while the undesired light is attentuated by reflection.

SUMMARY OF THE INVENTION

Therefore, a primary object of the present invention is to devise a discharge lamp in which ultraviolet radiation with short wavelengths can be advantageously cut and in which the amount of emitted 365 nm i-line light can be increased.

This object is achieved according to the invention by providing, a discharge lamp with a quartz glass arc tube, the inside or the outside of which is provided with a coating layer which has $Ta_2O_5$ as the main component, and with at least one additional coating layer that has a refraction coefficient which differs from the refraction coefficient of the coating layer comprised primarily of $Ta_2O_5$, by setting the reflection of the light with a wavelength of 365 nm which is incident on the outside or the inside of the arc tube to roughly 0% by these coating layers, and by cutting at least 50% of the ultraviolet radiation with wavelengths less than or equal to 230 nm by the above described coating layers.

The object of the invention is, furthermore, advantageously achieved by the thickness of the above described coating layer composed primarily of $Ta_2O_5$ being 20 nm to 900 nm as the optical layer thickness.

Additionally, the object of the invention is advantageously achieved by the primary component of the above described additional coating layer(s) being $Al_2O_3$ or $SiO_2$.

The object of the invention is also achieved by the outside and the inside of the arc tube being provided with the coating layers.

The object of the invention is also advantageously achieved by the above described discharge lamp being a mercury lamp of the short arc type.

The inventors have ascertained by intensive investigation that, by coating an arc tube with a coating film in which at least one layer has $Ta_2O_5$ as the main component, reflection of light with 365 nm can be prevented, and that ultraviolet radiation with short waves can also be advantageously cut. However, the invention is not made as an extension of the above-mentioned coating ideas of the prior art, and instead, according to the invention the effort is made to increase the light of 365 nm wavelength, in and of itself, which is emitted from the outer surface of the arc tube as opposed to the prior art efforts to use coatings to reflect light of certain wavelengths and thereby prevent emission of light of undesirable wavelengths while enabling emission of light having desired wavelengths.

Specifically, when light with 365 nm passes from the inside of the arc tube to the outside, the reflection which takes place between the interior of the arc tube and its inner surface and the reflection which takes place between the outer surface of the arc tube and its external space are reduced.

The above described object is achieved according to the invention by coating the outside and/or the inside of the arc tube with a coating layer structure which consist of a coating layer composed primarily of $Ta_2O_5$ and of at least one additional coating layer with a refraction coefficient which differs from that of the coating layer composed mainly of $Ta_2O_5$. The above described object is, therefore, achieved according to the invention only by this coating layer structure. Furthermore, it was found that this coating is effective for cutting ultraviolet radiation with short waves.

A film of this type which can suppress reflection is called a nonreflective coating or anti-reflecting film, as is described below. Here, an anti-reflecting film is a film which reduces reflection and increases the transmission factor, mainly on a surface of glass or other transparent material, as is described in the *Handbook of Optical Technics* (supplemented edition, 1985, published by Kubota and Hiroike, Asakura Press, Japan). Furthermore, nonreflective coating is a process in which the reflection loss on boundary surfaces with different refraction coefficients is reduced, as is described in *Optical Thin Films* (second edition, 1985, Kyoritsu Press, Japan).

With respect to a discharge lamp, in the case without a nonreflective coating, due to the relation between the refraction coefficient of quartz glass of roughly 1.48 with respect to light with a wavelength of 365 nm and the refraction coefficient of air of roughly 1.0 on one half side of the arc tube, roughly 4.0% reflection of the light with 365 nm occurs.

If this phenomenon occurs on the boundary surfaces between the interior of the arc tube and its inner surface, and between the outer surface of the arc tube and the outside air, the loss due to this reflection is roughly 8.0%. This means that the light with a wavelength of 365 nm which is emitted from the outer surface of the arc tube is attenuated by at least 8.0% by reflection.

According to the invention, the amount of radiant light with 365 nm is increased and the desired ultraviolet radiation with short waves is cut using the measure by which the outside or inside of the arc tube is subjected to a nonreflective coating of a composition which has a characteristic for absorption of the short wavelength ultraviolet radiation.

These and further objects, features and advantages of the present invention will become apparent from the following description when taken in connection with the accompanying drawings which, for purposes of illustration only, show several embodiments in accordance with the present invention.

DETAILED DESCRIPTION OF THE PREFERRED EMBODIMENTS

In the case of a conventional multilayer anti-reflecting coat, its characteristic is determined only by the characteristic of the coating film (the thicknesses of the film with a high refraction coefficient and of the film with a low refraction coefficient). In the case of the nonreflective coating according to the invention, however, the refraction coefficient of the arc tube also has a major effect.

In the following, in conjunction with the refraction coefficient of the arc tube, a refraction coefficient is described which is required for the nonreflective coating according to the invention.

If a transparent substrate with a refraction coefficient of $n_s$ is coated with a layer of transparent film with a thickness of d and a refraction coefficient of n, according to *Optical Thin Film* (second edition, 1985, Kyoritsu Press, Japan), for $n_s > n$ the following is obtained:

$2\pi nd/\lambda = \pi, 3\pi, (2m+1)\pi$ minimum value $R = ((n_s - n^2)/(n_s - n^2))^2$ To obtain a reflection factor of 0, at this point, it is necessary that $n = (n_s)^{0.5}$. If a coating layer has a refraction coefficient of 1.22, the reflection which occurs on the boundary surface between the light with a 365 nm wavelength and the arc tube can only be prevented by this coating layer because the refraction coefficient of quartz glass, as the material of the arc tube, is roughly 1.5. But, currently, there is no material which has a refraction coefficient of 1.22, and at the same time, the characteristic for the desired cutting of the ultraviolet radiation.

In the following, a case is described in which the nonreflective coating is formed by several coating layers. The several coating layers have a relation between a high refraction coefficient and a low refraction coefficient and can act as a nonreflective coating when they are in a relation to one another in which they each have a different refraction coefficient with respect to light with a wavelength of 365 nm.

In the case of two coating layers ($n_1$, $n_2$) the following applies for the complete prevention of reflection of a certain wavelength $\lambda$:

$\tan^2 g_2 = (n_1^2 \times (n_o - n_s) \times (n_s n_o - n_2^2))/((n_s n_1^2 - n_o n_2^2) \times (n_s n_o - n_1^2))$ $\tan^2 g_2 = (n_2^2 \times (n_o - n_s) \times (n_s n_o - n_1^2))/((n_s n_1^2 - n_o n_2^2) \times (n_s n_o - n_2^2))$ Here, $g_1 = 2\pi n_1 d_1/\Lambda$ and $g_2 = 2\pi n_2 d_2/\Lambda$. Further, the refraction coefficient of air is labeled $n_o$ and is equal to 1. Furthermore, the refraction coefficient of the respective coating layer is labeled $n_1$ and $n_2$ and the thickness of the respective coating layer is labeled $d_1$ and $d_2$.

Figure 3:
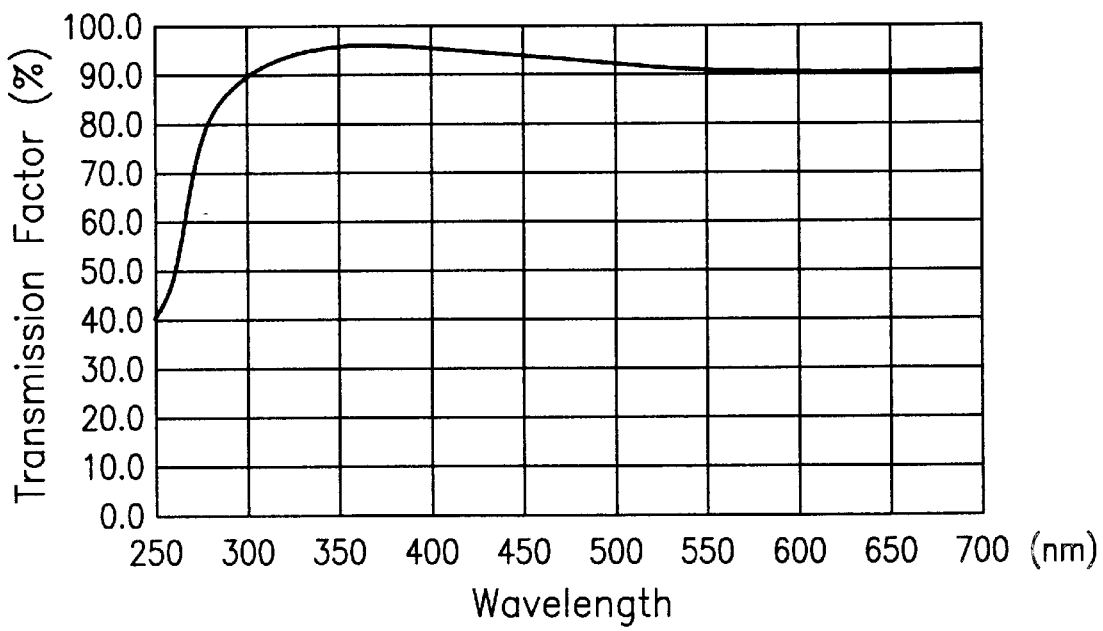
FIGS. 3 through 7 each show a spectrum produced by a respective lamp which has been subjected to a different coating according to the invention.
Figure 4:
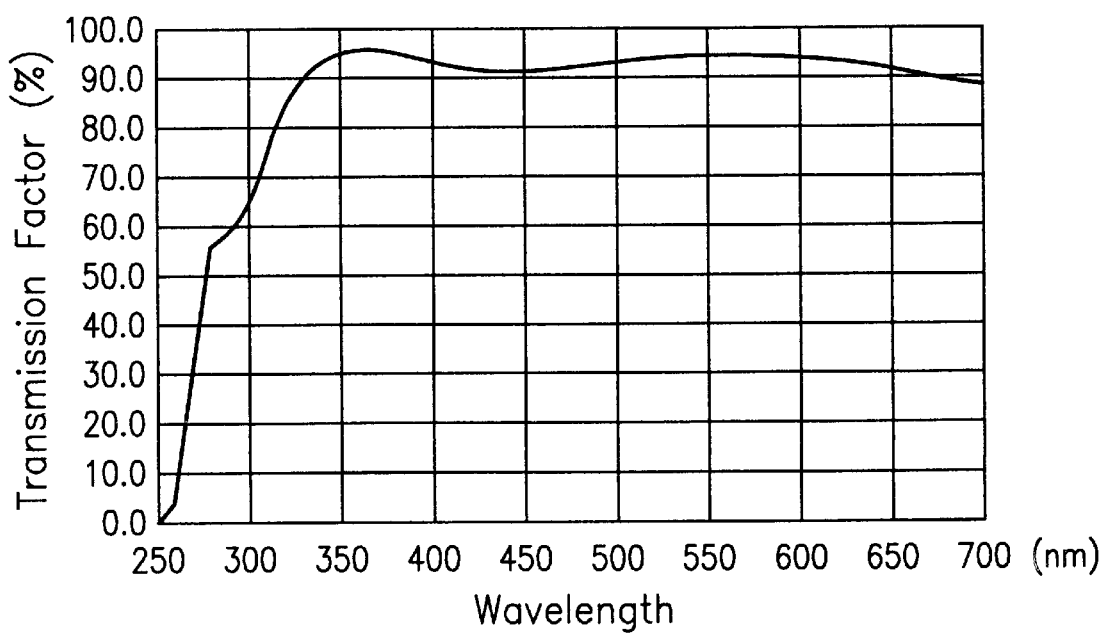
Figure 5:
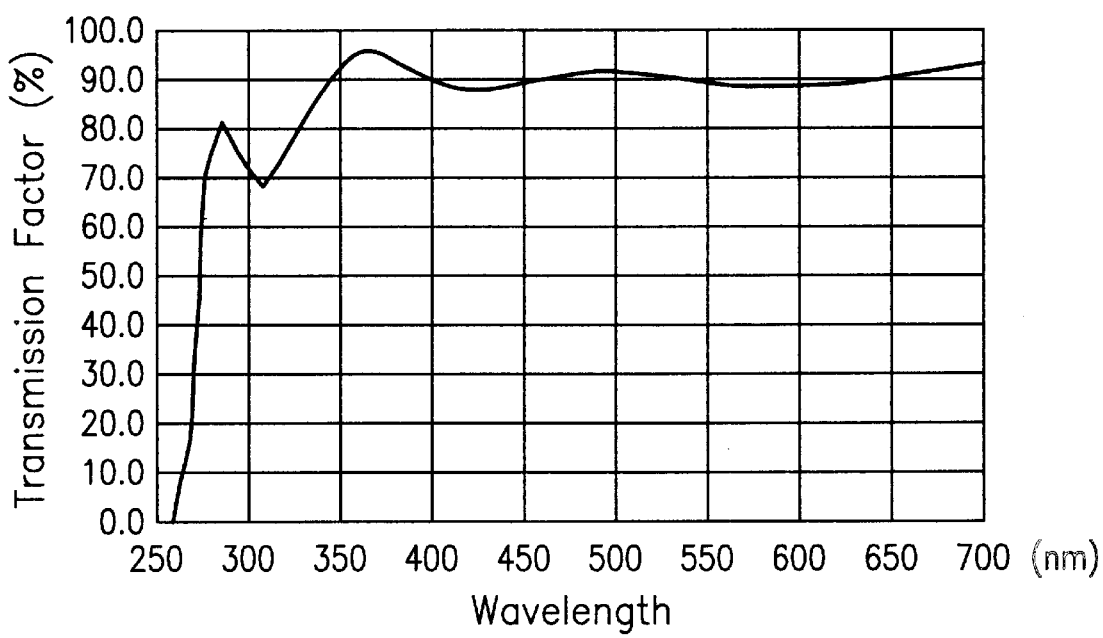
Figure 6:
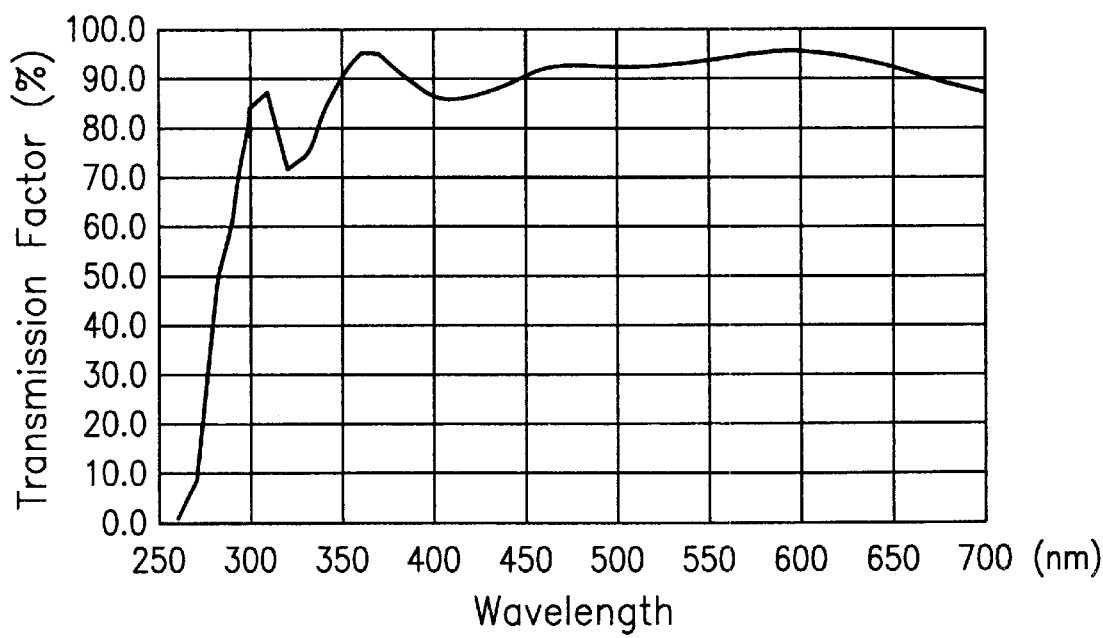

There are several solutions to the above described equations. If, when the above described equations are solved, for example, $n_1 = 1.472$ ($SiO_2$), $n_2 = 2.34$ ($Ta_2O_5$) and $n_s = 1.475$ (refraction coefficient of quartz glass for a wavelength of 365 nm), the following solutions are obtained:

Solution 1: $n_1 d_1 = 123$ nm
$n_2 d_2 = 24.3$ nm
Solution 2: $n_1 d_1 = 123$ nm
$n_2 d_2 = 207$ nm
Solution 3: $n_1 d_1 = 123$ nm
$n_2 d_2 = 389$ nm
Solution 4: $n_1 d_1 = 123$ nm
$n_2 d_2 = 572$ nm Next, the outer surface of the arc tube was coated with coating layers which satisfy the conditions of solutions 1 through 4, and the transmission factor of the radiant light was measured. FIGS. 3, 4, 5 and 6 show the respective result with the x-axis representing the wavelength and the y-axis the transmission factor. In FIG. 3, coating layers were provided of $Ta_2O_5$ of 24.3 nm and of $SiO_2$ of 123 nm. In FIG. 4, coating layers of $Ta_2O_5$ of 207 nm and $SiO_2$ of 123 nm were used. In FIG. 5, coating with a $Ta_2O_5$ layer of 389 nm and a $SiO_2$ layer of 123 nm were provided. In FIG. 6, coating layers of $Ta_2O_5$ of 572 nm and $SiO_2$ of 123 nm were provided.

This shows that, in all cases, a transmission factor of 96% of the light with 365 nm wavelength is obtained. In this embodiment, the outer surface of the arc tube was subjected to a nonreflective coating. It is, therefore, shown that an amount is advantageously emitted from the arc tube, with roughly 4% of the light being removed due to reflection which occurs on the boundary surface between the inner surface of the arc tube and the discharge space.

Furthermore, there are several mathematical solutions, and besides the mathematical solutions, there are several more approximated conditions under which the reflection factor 0 is approached.

Here, is it required that the material of the coating layer used can absorb the desired ultraviolet radiation. To obtain the above described conditions under which the light with 365 nm is nonreflective, it is required that the wavelength of 365 nm not be cut, and that at least 50% of the light with wavelengths of less than or equal to 230 nm be cut.

In the case of at least two coating layers, one of the two layers must satisfy the above described conditions. Here, it is necessary that the ultraviolet radiation cutting characteristic of the other coating layer(s) be less (has better transmission of the ultraviolet radiation) than the ultraviolet radiation cutting characteristic of the above described coating layer.

The inventors have found that only $Ta_2O_5$ satisfies the above described conditions. $CeO_2$ also cuts light with 365 nm due to overly large absorption of the ultraviolet radiation. Furthermore $TiO_2$ also cuts light with 365 nm to a small degree.

$ZrO_2$ does not cut light with 365 nm, but has a poorer characteristic for cutting the ultraviolet radiation with short waves than $Ta_2O_5$.

Furthermore, in the case of a coating with at least two layers, it is necessary that one layer be a coating layer composed mainly of $Ta_2O_5$, and that a material is chosen for the other coating layer or other coating layers in which the characteristic for cutting ultraviolet radiation with short wavelengths by $Ta_2O_5$ is low (with a high transmission factor of the ultraviolet radiation), such as $SiO_2$ or $Al_2O_3$.

Here, the coating layer composed mainly of $Ta_2O_5$ means that the $Ta_2O_5$ constitutes, by weight percentage, at least about 50% and preferably about 50% of the coating layer. For other materials, $HfO_2$, $ZrO_2$ and the like can be used with the $Ta_2O_5$.

As was described above, in the case of two layers, there are several conditions for the nonreflective coating. But, if the layer thickness of $Ta_2O_5$ becomes smaller, absorption of UV radiation becomes less, as is shown in FIG. 3. It was found that, for an optical layer thickness of less than or equal to 20 nm, the conditions under which at least 50% of the wavelengths of less than or equal to 230 nm are cut are no longer satisfied.

If the layer thickness of $Ta_2O_5$ is increased while maintaining the conditions under which light with 365 nm is nonreflective, the nonreflective wavelength range becomes smaller, as is illustrated in FIG. 6. If the layer thickness of $Ta_2O_5$ is further increased, the nonreflective wavelength range becomes smaller. In this state, the nonreflective state for the 365 nm wavelength does not occur, even if the thickness of the coating layer diverges only slightly from the desired value, causing control of the thickness of the coating layer to become a problem, and for which reason it diverges from practical conditions. The upper limit of a practicable Ta$_2$O$_5$ layer thickness is 900 nm.

In the case of three layers, there are several conditions for the absence of reflection. The minimum value as well as the maximum value of the thickness of the respective coating layer are, however, essentially the same as those in the above described case of two layers.

Therefore, in this way, the object of cutting the ultraviolet radiation with short wavelengths and the object of obtaining output of the i-line (365 nm wavelength) with high efficiency can be achieved at the same time by the Ta$_2$O$_5$ layer thickness being in the range from 20 nm to 900 nm as the optical layer thickness.

By coating with three layers the nonreflective coating becomes useful as a result of expanding the nonreflective wavelength range. Besides Ta$_2$O$_5$, materials are used which do not absorb ultraviolet radiation of a 365 nm wavelength and which have a refraction coefficient of 1.4 to 1.7, their refraction coefficient and ultraviolet absorption characteristic being important. SiO$_2$ and Al$_2$O$_3$ are suitable materials which satisfy these conditions.

Joint use of these films, i.e., one film composed mainly of Ta$_2$O$_5$, one film composed mainly of SiO$_2$, and one film composed mainly of Al$_2$O$_3$, can prevent reflection in a wide range of light wavelengths, from 350 nm up to 450 nm. Furthermore, the measure by which the three films are used as the coating layers prevents tension on the films and yields high mechanical strength, high heat resistance temperature, long durability and an almost ideal film.

A vacuum evaporation method, a spuutering method a CVD process and a dipping method immersion process are suited for the process of coating the arc tube with the above described materials for the nonreflective coating.

Furthermore, not only the outside of the arc tube, but also its inside can be coated with the materials for the nonreflective coating. In this way, reflection of 365 nm wavelength light on the boundary surface between the inside of the arc tube and its internal space can be reduced. This coating of the inside of the arc tube can be done using the CVD process and the dipping process.

In addition, both the inside and the outside of the arc tube can be provided with nonreflective coating layers. As was described above, roughly 4% of the light is reflected in the case in which this nonreflective coating layer is not provided. The transmission efficiency of the i-line is therefore increased by roughly 8% by providing the inside and the outside of the arc tube with nonreflective coatings.

Figure 1:
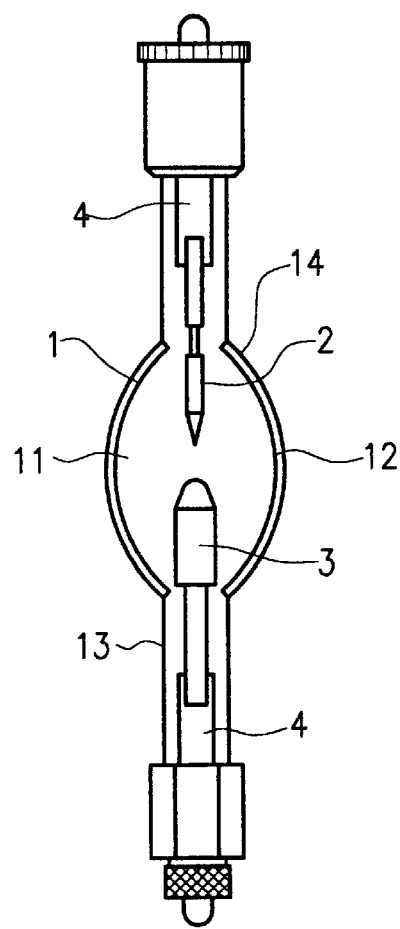
FIG. 1 shows an overall view of a mercury lamp of the short arc type according to the invention.

FIG. 1 shows an overall schematic view of mercury vapor discharge lamp of the short arc type with a nominal power consumption of 1 kW to which the above concepts of the invention have been applied. In the figure, an arc tube 1 contains a cathode 2 and an anode 3 which are arranged with their free ends disposed opposite one another with an arc gap therebetween. Cathode 2 and anode 3 are each supported by a lead pin and are joined to metal foil 4. The arc tube of the lamp has an enlargement 12 and hermetically sealed portions 13 on its opposite ends. A discharge space 11 is formed within the enlargement 12 of the arc tube.

Figure 2:
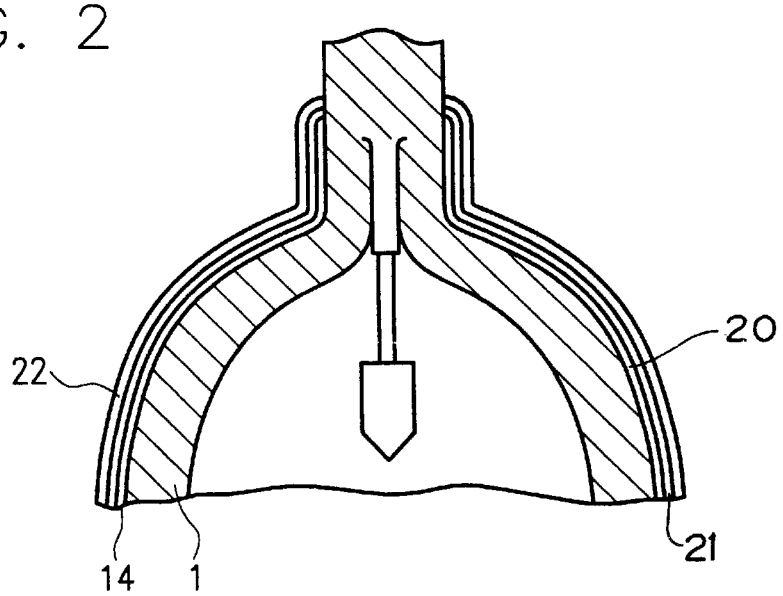
FIG. 2 shows a portion of the FIG. 1 lamps which has been enlarged to show the coatings according to the invention.

In this discharge lamp, the outer surface 14 of the enlargement 12 of the arc tube is coated with optical layer thickness Al$_2$O$_3$ of 90 nm, Ta$_2$O$_5$ of 180 nm and SiO$_2$ of 90 nm, each layer being applied using a vacuum evaporation method. These layers are shown in FIG. 2 where the outer surface 14 of arc tube 1 is coated with a Al$_2$O$_3$ layer 20, a Ta$_2$O$_5$ layer 21, and a SiO$_2$ layer 22.

Figure 7:
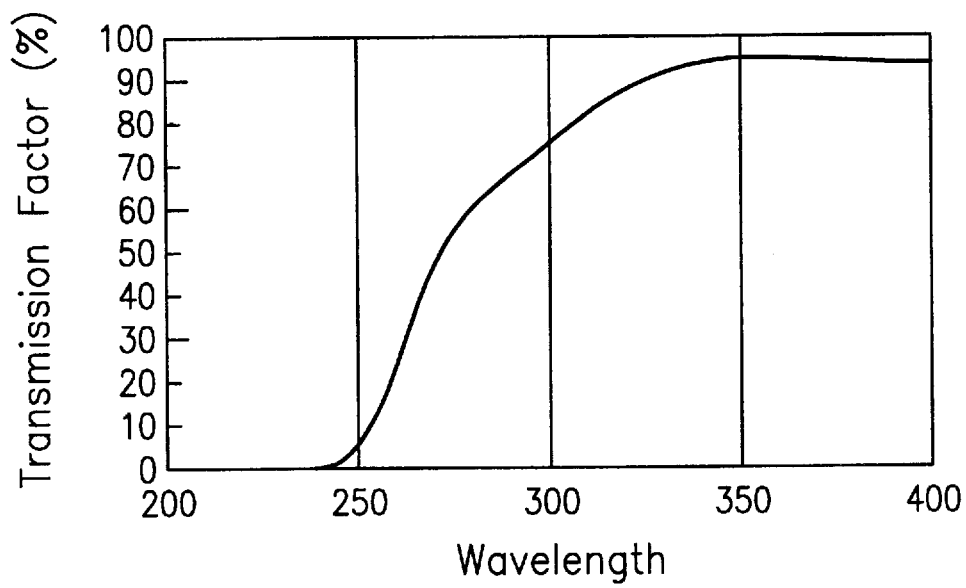

A lamp with this coating was operated. FIG. 7 shows its transmission factor at room temperature. The drawing shows that the transmission factor of light with 365 nm is greater than or equal to 96% and that ultraviolet radiation of wavelengths of 270 nm or less is cut by 50% or more.

Next, a mercury lamp (with a coating of the arc tube with an anti-reflecting film) and a conventional mercury lamp (without coating of the arc tube) were operated. The spectra were measured and the output of light with a 365 nm wavelength and the characteristic for cutting the ultraviolet radiation with short wavelengths was studied.

Figure 8:
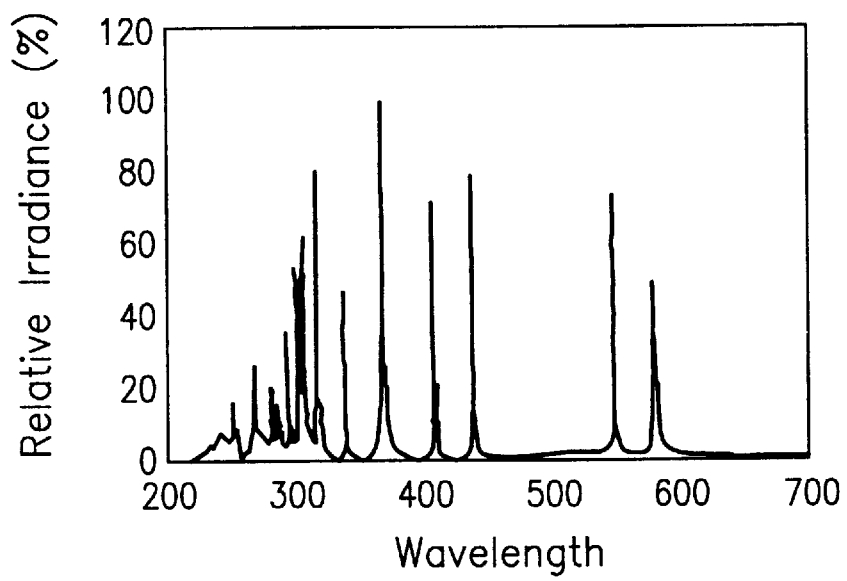
FIG. 8 shows a spectrum produced by a conventional lamp.
Figure 9:
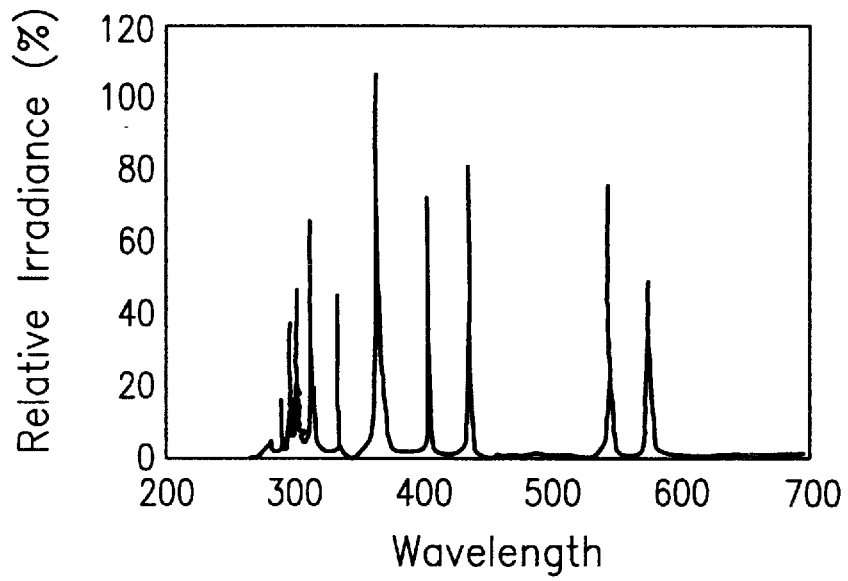
FIG. 9 shows a spectrum by a lamp which has been subjected to the coating according to the invention.
Figure 10:
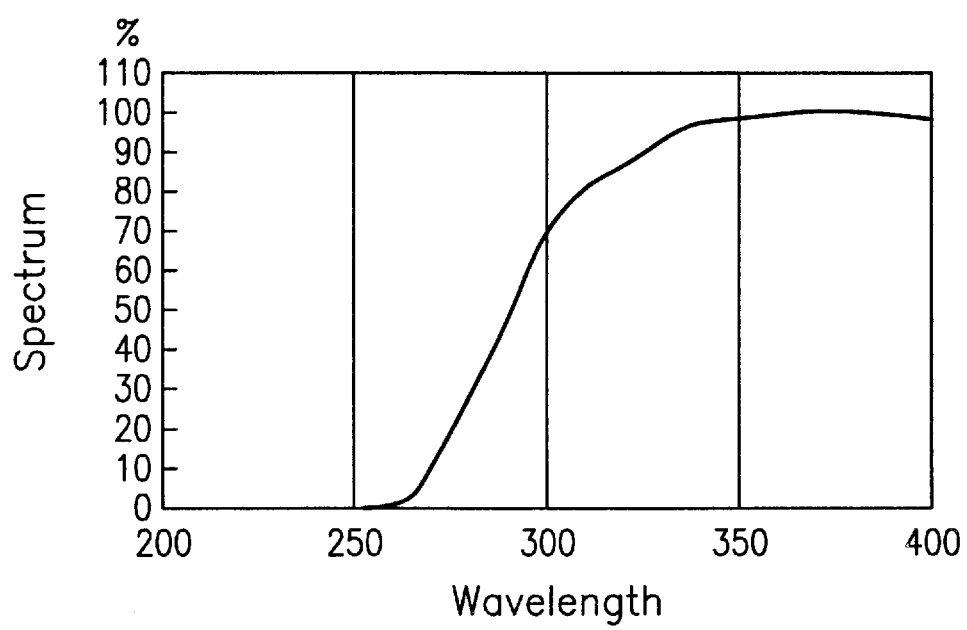
FIG. 10 shows the relationship between the spectrums represented in FIGS. 8 & 9.

FIG. 8 shows the spectrum of a conventional lamp. FIG. 9 shows a spectrum of a lamp according to the invention. FIG. 10 shows the result for which the spectrum in FIG. 9 was divided by the spectrum in FIG. 8.

This shows that, by heating the arc tube when the lamp is burning, with respect to the UV cutting characteristic, the range in which ultraviolet radiation is absorbed by the coating films shifts to the long wavelength side, that light with a wavelength of which 50% is transmitted roughly 290 nm and that the change compared to the conventional lamp is the more desirable one.

On the other hand, the radiation intensity of the light with a 365 nm wavelength increased for the lamp according to the invention as compared to the conventional lamp by 3 to 5%.

This means that, when using the mercury lamp according to the invention for a stepper, the throughput of the stepper can be increased by roughly 1% and the throughput of the production line of semiconductors can be likewise raised by 1%. These numbers illustrate the extremely high efficiency.

It is to be understood that although preferred embodiments of the invention have been described, various other embodiments and variations may occur to those skilled in the art. Any such other embodiments and variations which fall within the scope and spirit of the present invention are intended to be covered by the following claims.

What we claim is:

1. A discharge lamp comprising an arc tube made of quartz glass on which a plurality of coating layers are provided as a means for preventing reflection of light with a wavelength of 365 nm which is incident on the arc tube and for cutting at least 50% of ultraviolet radiation having wavelengths of 230 nm and below from light emitted from the arc tube; wherein said plurality of coating layers comprises a layer having a Ta$_2$O$_5$ main component and additional coating layers having a refraction coefficient which differ from that of the coating layer having Ta$_2$O$_5$ as the main component thereof; wherein said additional coating layers comprise an inner layer which has Al$_2$O$_3$ as a primary component thereof and an outer layer which has SiO$_2$ as a primary component thereof.

2. Discharge lamp according to claim 1, wherein the coating layer having Ta$_2$O$_5$ as the main component thereof has an optical layer thickness of from 20 nm to 900 nm.

3. Discharge lamp according to claim 1, wherein both an outer side and an inner side of the arc tube are provided with said plurality of layers.

4. Discharge lamp according to claim 1, wherein the discharge lamp is a mercury lamp of the short arc type.

5. Discharge lamp according to claim 1, wherein the outer side of the arc tube is provided with said plurality of layers.

6. Discharge lamp according to claim 1, wherein said plurality of layers comprise three layers, and wherein said layer having Ta$_2$O$_5$ as the main component thereof is an intermediate layer located between an inner layer and an outer layer.

7. Discharge lamp comprising an arc tube made of quartz glass on which a plurality of coating layers are provided as a means for preventing reflection of light with a wavelength of 365 nm which is incident on the arc tube and for cutting at least 50% of ultraviolet radiation having wavelengths of 230 nm and below from light emitted from the arc tube; wherein said plurality of coating layers comprises a layer having a $Ta_2O_5$ main component and at least one additional coating layer having a refraction coefficient which differs from that of the coating layer having $Ta_2O_5$ as the main component thereof; wherein the thicknesses of the coating layers and of the material of the arc tube produce a coefficient of reflectivity which is approximately zero at a wavelength of 365 nm, the coating layer having $Ta_2O_5$ as the main component thereof having an optical layer thickness of from 20 nm to 900 nm.

8. Discharge lamp according to claim 7, wherein said additional coating layers comprise a layer having a primary component selected from the group consisting of $Al_2O_3$ or $SiO_2$.

9. Discharge lamp according to claim 7, wherein both the outer side and the inner side of the arc tube are provided with said plurality of layers.

10. Discharge lamp according to claim 7, wherein the discharge lamp is a mercury lamp of the short arc type.

11. Discharge lamp according to claim 7, wherein the outer side of the arc tube is provided with said plurality of layers.

12. Discharge lamp according to claim 11, wherein said plurality of layers comprise three layers, and wherein said layer having $Ta_2O_5$ as the main component thereof is an intermediate layer.

* * * * *